US009155219B2

(12) United States Patent
Watanabe

(10) Patent No.: US 9,155,219 B2
(45) Date of Patent: Oct. 6, 2015

(54) BLANKING PLATE FOR ELECTRONICS RACK

(71) Applicant: FUJITSU LIMITED, Kawasaki-shi, Kanagawa (JP)

(72) Inventor: Takashi Watanabe, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/164,296

(22) Filed: Jan. 27, 2014

(65) Prior Publication Data

US 2014/0138336 A1 May 22, 2014

Related U.S. Application Data

(63) Continuation of application No. PCT/JP2011/068895, filed on Aug. 22, 2011.

(51) Int. Cl.
*H05K 7/18* (2006.01)
*H05K 7/14* (2006.01)

(52) U.S. Cl.
CPC ............... *H05K 7/18* (2013.01); *H05K 7/1488* (2013.01)

(58) Field of Classification Search
CPC ......... H05K 7/14; H05K 7/18; H05K 7/1488; H05K 7/1425; H05K 7/183; H05K 7/142; Y10T 16/525
USPC ......... 211/26, 183; 174/66, 67; 361/724, 727; 454/186; 109/58, 50, 23.78
See application file for complete search history.

(56) References Cited

U.S. PATENT DOCUMENTS

| 4,509,930 | A | * | 4/1985 | Schweigert et al. | .......... 446/109 |
| 4,685,892 | A | * | 8/1987 | Gould et al. | ................... 446/109 |
| 5,971,655 | A | * | 10/1999 | Shirakawa | ...................... 404/40 |
| 6,281,433 | B1 | * | 8/2001 | Decker et al. | ................. 174/394 |
| 6,758,353 | B2 | * | 7/2004 | Orr | ................................ 211/183 |
| 7,697,285 | B2 | * | 4/2010 | Donowho et al. | ............. 361/690 |
| 7,746,637 | B2 | * | 6/2010 | Donowho et al. | ............. 361/690 |
| 7,839,635 | B2 | * | 11/2010 | Donowho et al. | ............. 361/692 |
| 7,881,074 | B2 | * | 2/2011 | Lakoduk et al. | ............... 361/810 |

(Continued)

FOREIGN PATENT DOCUMENTS

JP 63-131191 8/1988
JP 8-307079 11/1996

(Continued)

OTHER PUBLICATIONS

International Search Report, mailed in connection with PCT/JP2011/068895 and mailed Oct. 25, 2011.

*Primary Examiner* — Patrick Hawn
(74) *Attorney, Agent, or Firm* — Fujitsu Patent Center

(57) ABSTRACT

A blank plate has flange portions capable of performing hinge movement around a direction of a shorter side. A blank plate has flange portions capable of performing hinge movement at positions different from the hinge positions of the flange portions, and a side of the blank plate is connected to the flange portions so as to be capable of performing hinge movement. A blank plate has flange portions capable of performing hinge movement at positions different from the hinge positions of the flange portions, and a side of the blank plate is connected to the flange portions so as to be capable of performing hinge movement. First lock mechanisms fix the blank plate and the blank plate perpendicularly to each other. Second lock mechanisms fix the blank plate and the blank plate perpendicularly to each other.

7 Claims, 18 Drawing Sheets

(56) References Cited

U.S. PATENT DOCUMENTS

| | | | | |
|---|---|---|---|---|
| 7,944,699 | B2 * | 5/2011 | Taylor | 361/724 |
| 8,327,598 | B2 * | 12/2012 | Shew et al. | 52/578 |
| 2004/0232098 | A1 * | 11/2004 | Orr | 211/183 |
| 2008/0310126 | A1 * | 12/2008 | Lakoduk et al. | 361/731 |
| 2009/0059486 | A1 * | 3/2009 | Taylor | 361/679.02 |
| 2010/0000953 | A1 * | 1/2010 | Shew et al. | 211/183 |

FOREIGN PATENT DOCUMENTS

| | | |
|---|---|---|
| JP | 2000-196264 | 7/2000 |
| JP | 2006-216594 | 8/2006 |
| JP | 2011-100768 | 5/2011 |

* cited by examiner

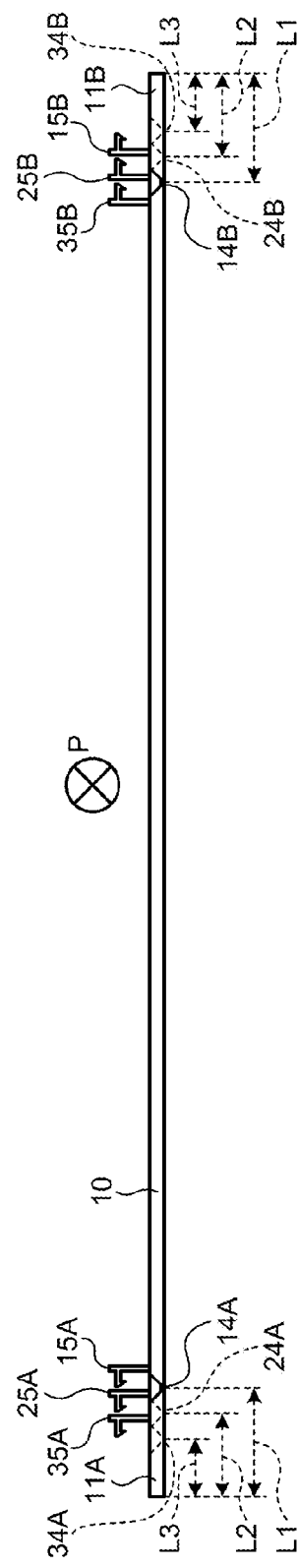

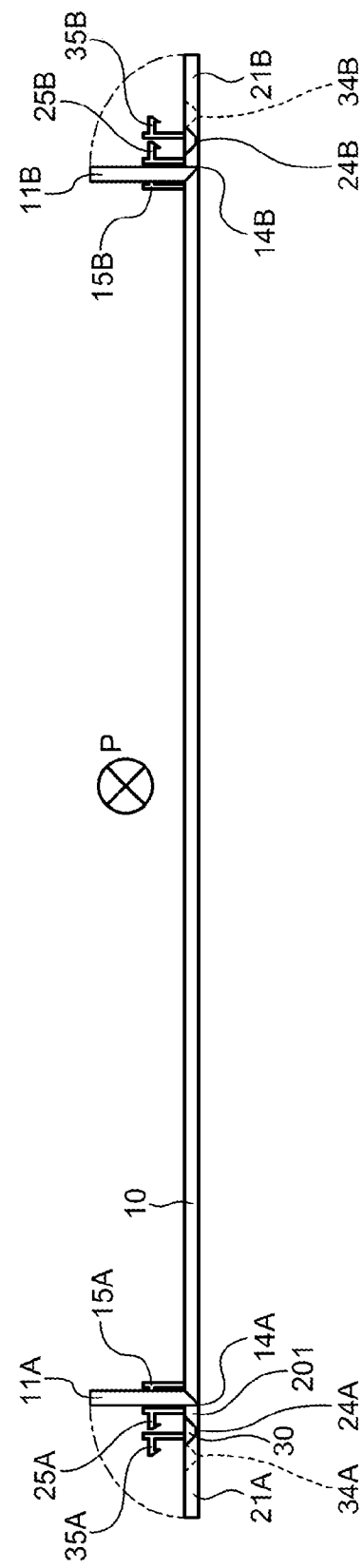

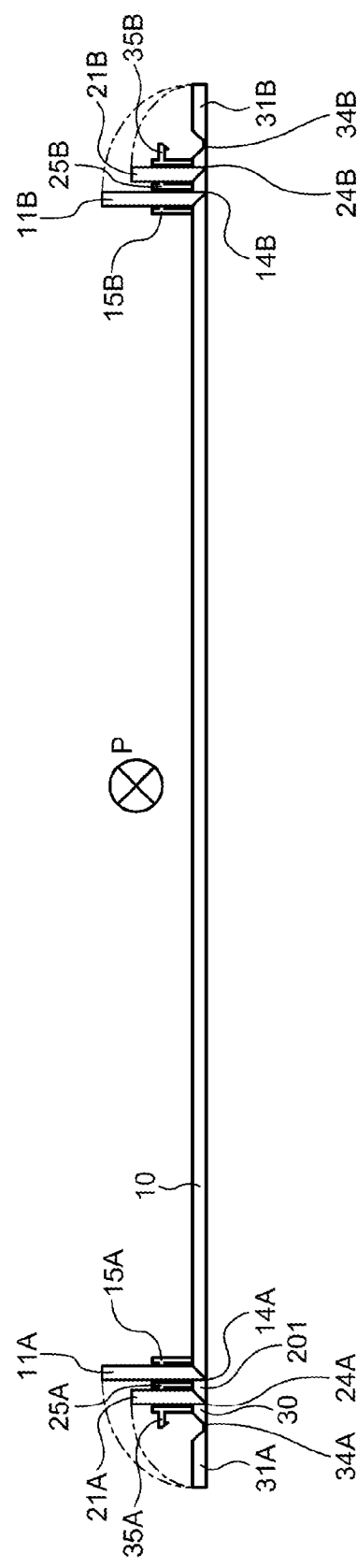

BLANKING PLATE FOR ELECTRONICS RACK

CROSS-REFERENCE TO RELATED APPLICATION

This application is a continuation of International Application No. PCT/JP2011/068895, filed on Aug. 22, 2011, the entire contents of which are incorporated herein by reference.

FIELD

The embodiments discussed herein are related to blank plates.

BACKGROUND

In a computer system, the number of electronic devices such as servers, storages, and network devices increases as the scale of the system becomes larger. If the number of electronic devices increases as described above, a storage frame called rack is used to store efficiently the electronic devices and realize a small footprint. Further, if the electronic devices are to be mounted in the rack, housing-mount rails for mounting the housings of the electronic devices are laid from the front surface to the rear surface of the rack. Then, the housings of the electronic devices are placed on the housing-mount rails and the electronic devices are stacked in the rack. Such a rack is regulated in height of housings to be stored by 1 U.

Even if the electronic devices are to be mounted in the rack, it is not requested that the electronic devices are stored in the entire rack. If the electronic devices are not stored in the entire rack, there occurs an empty space at the front side of the rack where no electronic devices are mounted. When there is an open space at the front side of the rack, air exhausted from the electronic devices flows back into the electronic devices, and the electronic devices suck again the returned exhaust air. In this state, the electronic devices are not properly cooled but accumulate heat that may cause a crash of the electronic devices. Thus, blank plates are attached to the space at the front side of the rack to fill the front space.

Since there may be spaces of various sizes in the rack, blank plates for 1 U, 2 U, and 3 U are provided to support spaces of all sizes. Conventionally, it is determined a space of what U is open at the front side of the rack, and then a blank plate appropriate for filling the determined space is selected and attached. In the case of adding an electronic device, after the blank panel is removed, the housing is mounted, a blank panel suited for the remaining space is selected, and then the selected blank panel is attached. Meanwhile, removing a mounted electronic device from the rack also requests reselection and attachment of a blank plate. Thus, a plurality of blank plates are prepared at any time and a storage space is secured for the blank plates. In addition, to add or remove a housing, there arises a troublesome labor of replacement and attachment of blank plates.

To fill a space open at the front side of a rack, there has been suggested a conventional technique by which, in a rack to which a printed board is attached, two plates formed by corrugated plates or rigid plates are stacked together and placed according to the width of an empty slot to seal the rack. In addition, there has been suggested a conventional technique by which plates with convex and concave portions on both sides are joined together by fitting the convex and concave portions, thereby to adjust the width of the plates and seal the rack to which a printed board is attached.

Patent Literature 1: Japanese Laid-open Patent Publication No. 08-307079
Patent Literature 2: Japanese Laid-open Utility Model Publication No. 63-131191

However, in the case of using the conventional technique by which plates are stacked, a plurality of plates are prepare to support the space sizes of 1 U, 2 U, and 3 U. Furthermore, some blank plates are added or removed. This causes wasteful operations such as securing a storage place for spare or unused blank plates or scrapping of unused blank plates. In the case of using the method in which plates are joined together with convex and concave portions to match the plate size to the space size, a plurality of plates are prepare to support the space sizes of 1 U, 2 U, and 3 U. Furthermore, some blank plates are added or removed. Further, for formation of an appropriate space, troublesome operations are performed such as removing the blank plates, fitting the convex and concave portions, and then attaching the blank plates again.

SUMMARY

According to an aspect of an embodiment, a blank plate includes: a first plate-like member that has first attachment portions for attachment to support columns of a rack in the vicinity of both longitudinal ends thereof and has both longitudinal end portions including the first attachment portions capable of performing hinge movement around a direction of a shorter side; a second plate-like member that has second attachment portions for attachment to the support columns of the rack in the vicinity of both longitudinal ends thereof, has both longitudinal ends portions including the second attachment portions capable of performing hinge movement around a direction of a shorter side at positions different from the hinge positions of the both longitudinal ends portions of the first plate-like member, and has one longer side to which a longer side of the first plate-like member is connected so as to be capable of performing hinge movement; a third plate-like member that has third attachment portions for attachment to the support columns of the racks in the vicinity of both longitudinal ends thereof, has both longitudinal ends portions including the third attachment portions capable of performing hinge movement around a direction of a shorter side at positions different from the hinge positions of the both longitudinal ends portions of the first plate-like member and the second plate-like member, and has a longer side to which the other longer side of the second plate-like member is connected so as to be capable of performing hinge movement; a first lock mechanism that fixes the second plate-like member and the first plate-like member perpendicularly to each other; and a second lock mechanism in which the third plate-like member performs hinge movement at the side at which the first plate-like member exists with respect to the second plate-like member in a state of being locked by the first lock mechanism to fix the third plate-like member and the second plate-like member perpendicularly to each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is an upper view of the blank plate according to the first embodiment.

FIG. 5A is a diagram for describing a state of the blank plate in which one flange portion is folded.

FIG. 5B is a diagram for describing a state of the blank plate in which two flange portions are folded.

DESCRIPTION OF EMBODIMENTS

Preferred embodiments of the present invention will be explained with reference to accompanying drawings.

However, the blank plates disclosed in the subject application are not limited by the following embodiments.

[a] First Embodiment

Figure 1:
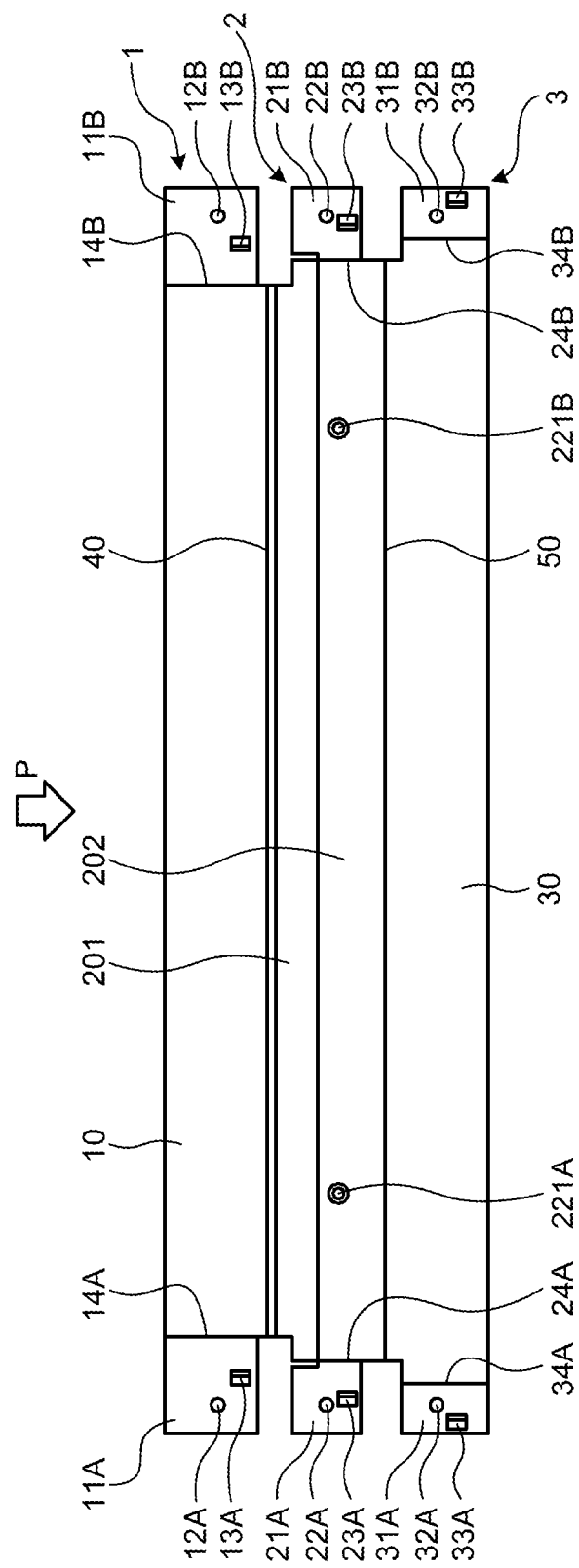
FIG. 1 is a front view of blank plates according to a first embodiment.
Figure 2:
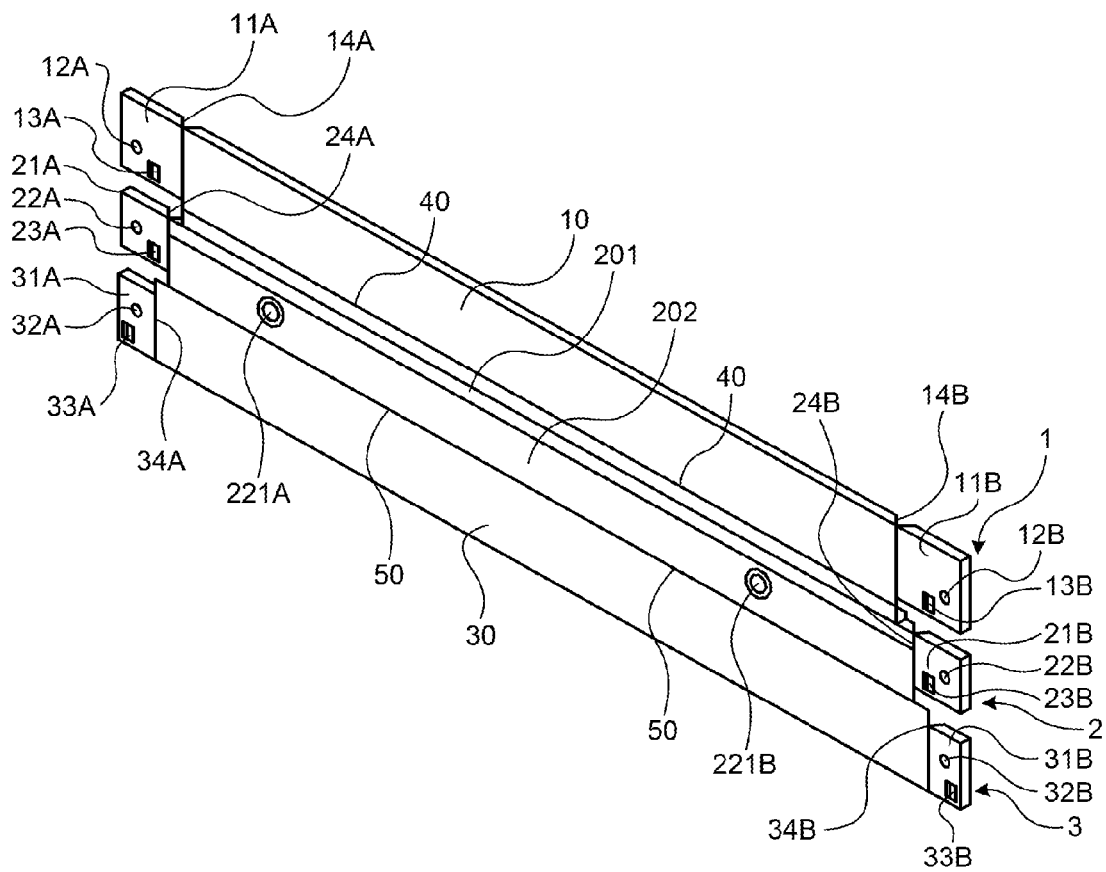
FIG. 2 is a perspective view of the blank plates according to the first embodiment.
Figure 3:
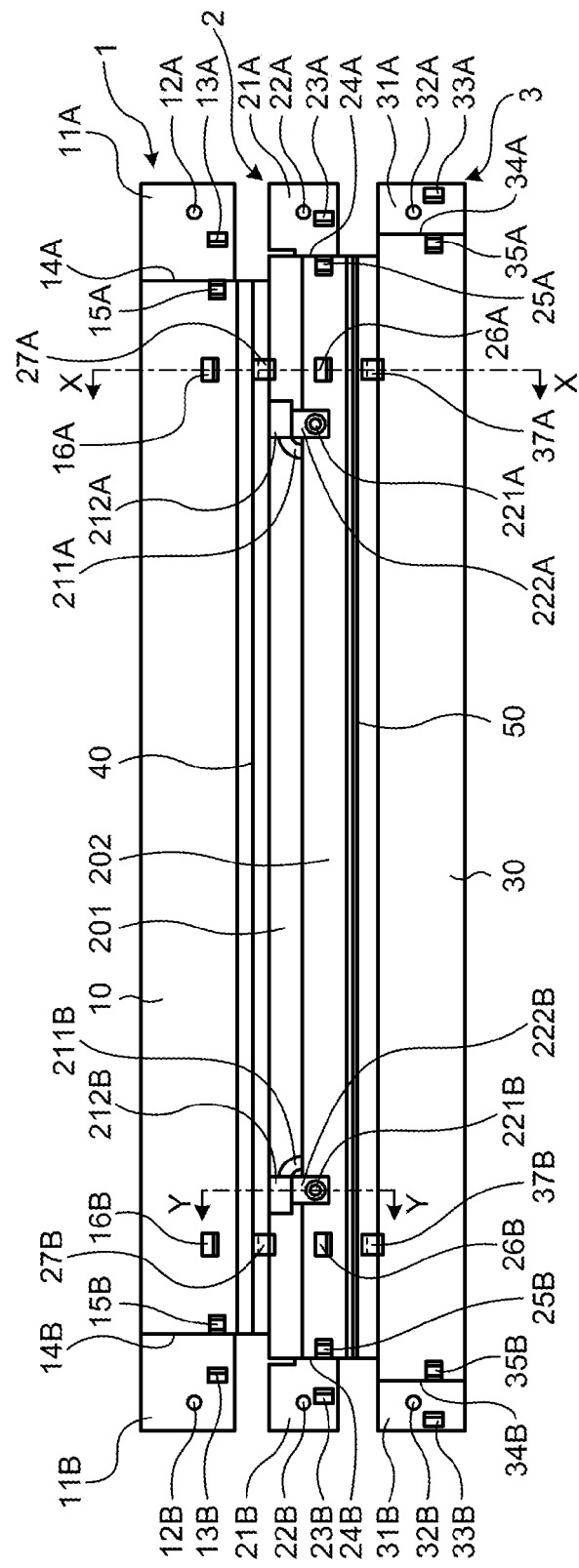
FIG. 3 is a rear view of the blank plates according to the first embodiment.

FIG. 1 is a front view of the blank plates according to a first embodiment. FIG. 2 is a perspective view of the blank plates according to the first embodiment. FIG. 3 is a rear view of the blank plates according to the first embodiment. In the following descriptions, for the sake of convenience, the left side as seen in FIG. 1 will be referred to as "upper side," and the right side as seen in FIG. 1 as "lower side." That is, in the following description, the direction of arrow P in FIG. 1 is a direction moving from the upper to lower sides. In addition, in the following descriptions, for the sake of convenience, the surfaces of blank plates 1 to 3 illustrated in FIG. 1 will be referred to as "front surfaces," and the surfaces of the blank plates 1 to 3 illustrated in FIG. 3 will be referred to as "rear surfaces."

As illustrated in FIGS. 1 and 2, the blank plates according to the embodiment include a blank plate 1, a blank plate 2, and a blank plate 3. The blank plate 1 has a plate member 10, a flange portion 11A, and a flange portion 11B. The blank plate 2 has a plate member 201, a plate member 202, a flange portion 21A, and a flange portion 21B. The blank plate 3 has a plate member 30, a flange portion 31A, and a flange portion 31B. In the embodiment, shorter sides of the blank plates 1 to 3 have a length of 1 U.

The plate member 10 and the plate member 201 are coupled together by a coupling portion 40. The plate member 202 and the plate member 30 are coupled together by a coupling portion 50. The plate member 10 and the plate member 201 can make hinge movement around the coupling portion 40. The plate member 202 and the plate member 30 can make hinge movement around the coupling portion 50.

In the embodiment, for example, the plate member 10 and the plate member 201 are attached to a sheet of plastic resin such as polypropylene so that the plate member 10 and the plate member 201 are made foldable. Similarly, the plate member 202 and the plate member 30 are attached to a sheet of plastic resin so that the plate member 202 and the plate member 30 are made foldable. However, the sheet to which the plate member 10, the plate member 201, the plate member 202, and the plate member 30 are attached, may be formed by any flexible material. To form the coupling portion 40 and the coupling portion 50, alternatively, a portion of one plastic plate including the plate member 10 and the plate member 201 corresponding to the coupling portion 40 may be made thin and foldable, for example.

The plate member 202 is provided with rotation shafts 221A and 221B. The rotation shafts 221A and 221B are rotation shafts for fixing claws to couple the plate member 201 and the plate member 202 as described later. Although described later in detail, the plate member 201 and the plate member 202 are attachable to and detachable from each other by a coupling member. When being coupled together, the plate member 201 and the plate member 202 are fixed to each other.

In this arrangement, shorter sides of the plate member 10 and the plate member 30 have a length of 1 U, and a shorter side of the coupled plate members 201 and 202 have a length of 1 U.

The plate member 10 and the flange portion 11A are coupled together by a coupling portion 14A. The plate member 10 and the flange portion 11B are coupled together by a coupling portion 14B. The flange portion 11A can make hinge movement with respect to the plate member 10 around the coupling portion 14A. Similarly, the flange portion 11B can make hinge movement with respect to the plate member 10 around the coupling portion 14B.

The plate member 202 and the flange portion 21A are coupled together by a coupling portion 24A. The plate member 202 and the flange portion 21B are coupled together by a coupling portion 24B. The flange portion 21A can make hinge movement with respect to the plate member 202 around the coupling portion 24A. Similarly, the flange portion 21B can make hinge movement with respect to the plate member 202 around the coupling portion 24B.

The plate member 30 and the flange portion 31A are coupled together by a coupling portion 34A. The plate member 30 and the flange portion 31B are coupled together by a coupling portion 34B. The flange portion 31A can make hinge movement with respect to the plate member 30 around the coupling portion 34A. Similarly, the flange portion 31B can make hinge movement with respect to the plate member 30 around the coupling portion 34B.

The coupling portions 14A, 14B, 24A, 24B, 34A, and 34B can be formed by the same method for forming the coupling portion 40 and the coupling portion 50, for example.

The flange portion 11A is provided with an attachment hole 12A and a flange fixing claw receiving portion 13A. The flange portion 11B is provided with an attachment hole 12B and a flange fixing claw receiving portion 13B. The blank plate 1 can be fixed to a support column of the rack by inserting fixing tools such as bolts into the attachment holes 12A and 12B and fixing the same to the support column of the rack. The flange fixing claw receiving portions 13A and 13B will be described later.

The flange portion 21A is provided with an attachment hole 22A and a flange fixing claw receiving portion 23A. The flange portion 21B is provided with an attachment hole 22B and a flange fixing claw receiving portion 23B. The blank plate 2 can be fixed to a support column of the rack by inserting fixing tools such as bolts into the attachment holes 22A and 22B and fixing the same to the support column of the rack. The flange fixing claw receiving portions 23A and 23B will be described later.

The flange portion 31A is provided with an attachment hole 32A and a flange fixing claw receiving portion 33A. The flange portion 31B is provided with an attachment hole 32B and a flange fixing claw receiving portion 33B. The blank plate 3 can be fixed to a support column of the rack by inserting fixing tools such as bolts into the attachment holes 32A and 32B and fixing the same to the support column of the rack. The flange fixing claw receiving portions 33A and 33B will be described later.

As illustrated in FIG. 3, the plate member 10 of the blank plate 1 is provided with flange fixing claws 15A and 15B and claw receiving portions 16A and 16B. The plate member 201 of the blank plate 2 is provided with locking claws 27A and 27B. The plate member 202 of the blank plate 2 is provided with flange fixing claws 25A and 25B and claw receiving portions 26A and 26B. The plate member 30 of the blank plate 3 is provided with flange fixing claws 35A and 35B and locking claws 37A and 37B.

The flange portion 11A makes hinge movement around the coupling portion 14A. The flange portion 11A makes hinge movement toward the rear surface of the plate member 10 and folds until reaching a position perpendicular to the plate member 10. Then, when the flange portion 11A is perpendicular to the plate member 10, the flange fixing claw 15A and the flange fixing claw receiving portion 13A fit together. When the flange fixing claw 15A and the flange fixing claw receiving portion 13A fit together, the flange portion 11A is fixed perpendicular to the plate member 10.

The flange portion 11B makes hinge movement around the coupling portion 14B. The flange portion 11B makes hinge movement toward the rear surface of the plate member 10 and folds until reaching a position perpendicular to the plate member 10. Then, when the flange portion 11B is perpendicular to the plate member 10, the flange fixing claw 15B and the flange fixing claw receiving portion 13B fit together. When the flange fixing claw 15B and the flange fixing claw receiving portion 13B fit together, the flange portion 11B is fixed perpendicular to the plate member 10.

The flange portion 21A makes hinge movement around the coupling portion 24A. The flange portion 21A makes hinge movement toward the rear surfaces of the plate member 201 and the plate member 202, and folds until reaching a position perpendicular to the plate member 201 and the plate member 202. Then, when the flange portion 21A is perpendicular to the plate member 201 and the plate member 202, the flange fixing claw 25A and the flange fixing claw receiving portion 23A fit together. When the flange fixing claw 25A and the flange fixing claw receiving portion 23A fit together, the flange portion 21A is fixed perpendicular to the plate member 201 and the plate member 202.

The flange portion 31B makes hinge movement around the coupling portion 34B. The flange portion 31B makes hinge movement toward the rear surface of the plate member 30 and folds until reaching a position perpendicular to the plate member 30. Then, when the flange portion 31B is perpendicular to the plate member 30, the flange fixing claw 35B and the flange fixing claw receiving portion 33B fit together. When the flange fixing claw 35B and the flange fixing claw receiving portion 33B fit together, the flange portion 31B is fixed perpendicular to the plate member 30.

The folding and fixation of the flange portions 11A to 31A and 11B to 31B will be described later in detail.

The plate member 10 and the plate member 201 make hinge movement around the coupling portion 40 in a direction toward each other's rear surface, and fold until reaching a position perpendicular to each other. When the plate member 10 and the plate member 201 are perpendicular to each other, the claw receiving portion 16A and the locking claw 27A fit together, and the claw receiving portion 16B and the locking claw 27B fit together. When the claw receiving portion 16A and the locking claw 27A fit together and the claw receiving portion 16B and the locking claw 27B fit together, the plate member 10 and the plate member 201 are fixed perpendicular to each other.

The plate member 30 and the plate member 202 make hinge movement around the coupling portion 50 in a direction toward each other's rear surface, and fold until reaching a position perpendicular to each other. When the plate member 30 and the plate member 202 are perpendicular to each other, the claw receiving portion 26A and the locking claw 37A fit together, and the claw receiving portion 26B and the locking claw 37B fit together. When the claw receiving portion 26A and the locking claw 37A fit together and the claw receiving portion 26B and the locking claw 37B fit together, the plate member 30 and the plate member 202 are fixed perpendicular to each other.

The hinge movement and fixation of the plate members 10, 201, and 202 will be described later in detail.

As illustrated in FIG. 3, the plate member 201 has guide grooves 211A and 211B and piece receiving portions 212A and 212B.

As illustrated in FIG. 3, the plate member 202 has rotation shafts 221A and 221B and coupling pieces 222A and 222B. The coupling piece 222A is attached to the plate member 202 so as to be rotatable around the rotation shaft 221A in a direction parallel to the plate surface of the plate member 202. The coupling piece 222B is attached to the plate member 202 so as to be rotatable around the rotation shaft 221B in a direction parallel to the plate surface of the plate member 202.

When coupling together the plate member 201 and the plate member 202, the coupling piece 222A rotates around the rotation shaft 221A, moves along the guide groove 211A, and fits between the piece receiving portion 212A and the guide groove 211A. When coupling together the plate member 201 and the plate member 202, the coupling piece 222B rotates around the rotation shaft 221B, moves along the guide groove 211B, and fits between the piece receiving portion 212B and the guide groove 211B. When the coupling piece 222A fits between the piece receiving portion 212A and the guide groove 211A and the coupling piece 222B fits between the piece receiving portion 212B and the guide groove 211B, the plate member 201 and the plate member 202 are coupled and fixed to each other.

Attachment and detachment of the plate member 201 and the plate member 202 will be described later in detail.

Next, referring to FIGS. 4, 5A, and 5B, folding and fixation of the flange portions 11A to 31A and 11B to 31B will be described. FIG. 4 is an upper view of the blank plate according to the first embodiment. FIG. 5A is a diagram for describing a state of the blank plate in which one flange portion is folded. FIG. 5B is a diagram for describing a state of the blank plate in which two flange portions are folded. FIGS. 4, 5A, and 5B are diagrams of the blank plate as seen from the direction of arrow P in FIG. 1. For convenience of description, FIG. 4 represents the coupling portions 24A, 24B, 34A, and 34B by dotted lines.

In the state of FIG. 4, the plate member 10, the flange portion 11A, and the flange portion 11B are represented. As illustrated in FIG. 4, the flange portion 11A has a distance L1 from a side end thereof to the coupling portion 14A. Similarly, the flange portion 11B has a distance L1 from a side end thereof to the coupling portion 14B. The flange portion 21A has a distance L2 from a side end thereof to the coupling portion 24A. Similarly, the flange portion 21B has a distance L2 from a side end thereof to the coupling portion 24B. The flange portion 31A has a distance L3 from a side end thereof to the coupling portion 34A. Similarly, the flange portion 31B has a distance L3 from a side end thereof to the coupling portion 34B. The distances have the relationship L1>L2>L3. That is, the flange portions 11A to 31A are longitudinally folded at different positions. The flange portions 11B to 31B are folded at different positions. According to the folding positions of the flange portions 11A to 31A, the flange fixing claws 15A to 35A are also longitudinally arranged at different positions. According to the folding positions of the flange portions 11B to 31B, the flange fixing claws 15B to 35B are also longitudinally arranged at different positions.

FIG. 5A illustrates the state in which the flange portions 11A and 11B in the state of FIG. 4 make hinge movement and are perpendicular to the plate member 10. In the state of FIG. 5A, the flange fixing claw receiving portion 13A (refer to FIG. 3) of the flange portion 11A fits to the flange fixing claw 15A to fix the flange portion 11A. In addition, the flange fixing claw receiving portion 13B (refer to FIG. 3) of the flange portion 11B fits to the flange fixing claw 15B to fix the flange portion 11B.

FIG. 5B illustrates the state in which the flange portions 21A and 21B in the state of FIG. 5A make hinge movement and are perpendicular to the plate member 201 and the plate member 202. In the state of FIG. 5B, the flange fixing claw receiving portion 23A (refer to FIG. 3) of the flange portion 21A fits to the flange fixing claw 25A to fix the flange portion 21A. In addition, the flange fixing claw receiving portion 23B (refer to FIG. 3) of the flange portion 21B fits to the flange fixing claw 25B to fix the flange portion 21B.

As illustrated in FIG. 5B, the folded flange portion 11A and flange portion 21A are located at different positions in a long axis direction. In addition, the folded flange portion 11B and flange portion 21B are located at different positions in a long axis direction. Accordingly, even if, in the state of FIG. 5B, the coupled plate member 201 and pate member 202 are folded toward the rear surface of the plate member 30 and the plate member 10 is folded toward the rear surface of the plate member 201, the flange portion 11A and the flange portion 21A do not contact each other. In this case, the flange portion 11A and the flange portion 21A also do not contact each other. Therefore, when the flange portions 11A, 11B, 21A, and 21B are folded, the plate member 10 and the coupled plate member 201 and plate member 202 can be folded.

The flange portion 31A is longitudinally folded at a position different from those of the flange portions 11A and 21A. In addition, the flange portion 31A is longitudinally folded at a position different from those of the flange portions 11A and 21A. Therefore, the positional relationship between the flange portions 11A and 11B and the flange portions 31A and 31B, and the positional relationship between the flange portions 21A and 21B and the flange portions 31A and 31B are the same as the above-described positional relationship between the flange portions 11A and 11B and the flange portions 21A and 21B. Therefore, when any of the blank plates 1 to 3 has two folded flange portions, the plate members of the two folded flange portions of the blank plate can be folded.

In this arrangement, when the plate members are folded without folding the flange portions 11A to 31A and 11B to 31B, if an attempt is made to attach the blank plates in that state to the support column of the rack, portions of the folded blank plates to be coupled to the support column of the rack contact the support column of the rack. Thus, it is difficult for the blank plates with the plate members folded to be attached to the rack unless the flange portions 11A to 31A and 11B to 31B are folded. Accordingly, in the embodiment, the flange portions 11A to 31A and 11B to 31B are made foldable.

Figure 6A:
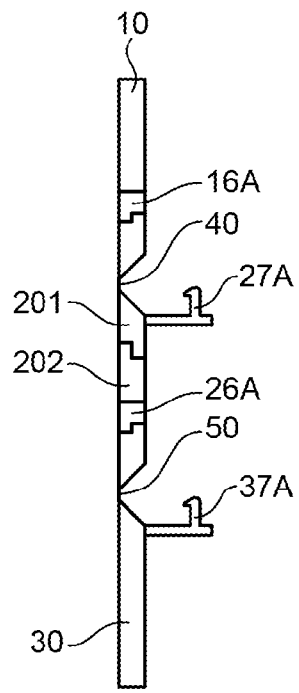
FIG. 6A is a cross section view of FIG. 3 taken along line X-X.
Figure 6B:
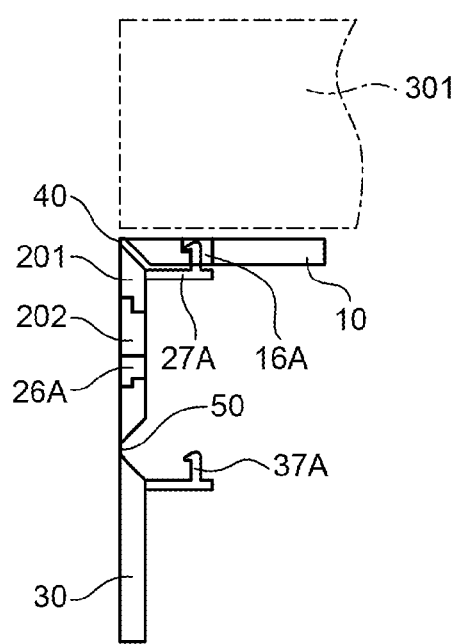
FIG. 6B is a diagram for describing the state in which a blank plate 1 is folded.
Figure 6C:
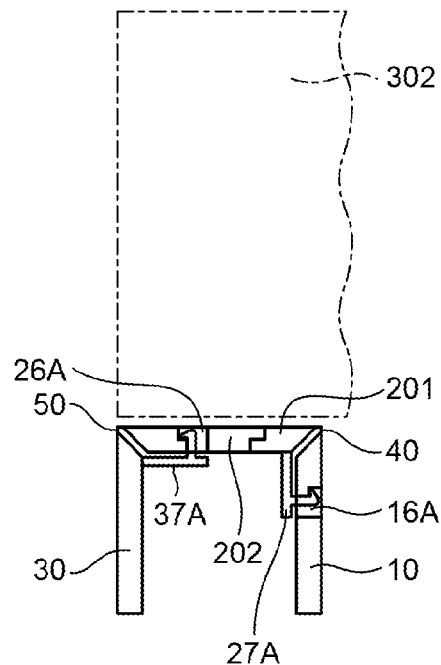
FIG. 6C is a diagram for describing the state in which blank plates 1 and 2 are folded.
Figure 6D:
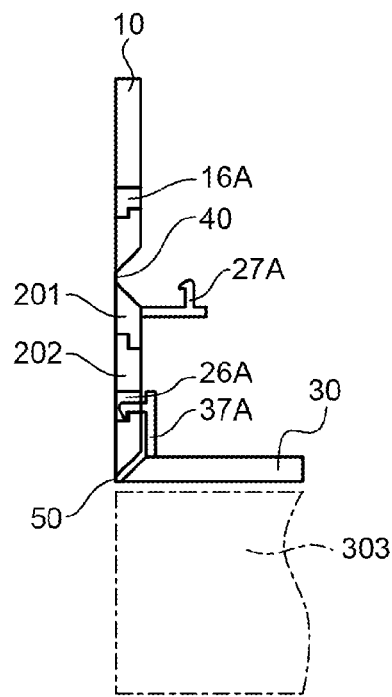
FIG. 6D is a diagram for describing the state in which a blank plate 3 is folded.
Figure 6E:
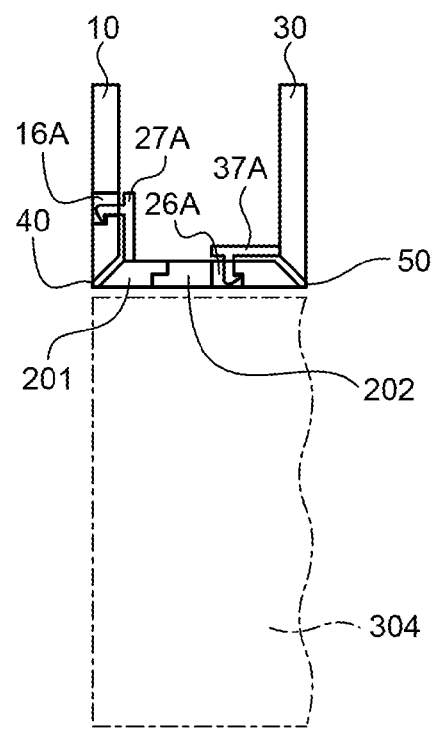
FIG. 6E is a diagram for describing the state in which the blank plates 2 and 3 are folded.

Next, referring to FIGS. 6A to 6E, hinge movement and fixation of the plate members 10, 201, 202, and 30 will be described. FIG. 6A is a cross section view of FIG. 3 taken along line X-X. FIG. 6B is a diagram for describing the state in which the blank plate 1 is folded. FIG. 6C is a diagram for describing the state in which the blank plates 1 and 2 are folded. FIG. 6D is a diagram for describing the state in which the blank plate 3 is folded. FIG. 6E is a diagram for describing the state in which the blank plates 2 and 3 are folded.

Components illustrated in FIG. 6A are the same as those illustrated in FIGS. 1 and 3 with the same reference signs. The right side as seen in FIG. 6A refers to the front side of the blank plate, and the left side as seen in FIG. 6A refers to the rear side of the blank plate. The coupling portions 40 and 50 have flat front surfaces and grooves on rear surfaces. However, the coupling portions 40 and 50 may have any other structure as far as the plate member 10 and the plate member 201 can make hinge movement toward rear sides thereof and the plate member 202 and the plate member 30 can make hinge movement toward rear sides thereof. In the state of FIG. 6A, the blank plates 1 to 3 are fixed to the support columns of the rack. In the state of FIG. 6A, there is no space open at the front side of the rack blocked by the blank plates 1 to 3.

FIG. 6B illustrates the state in which the plate member 10 in the state of FIG. 6A is folded. In the state of FIG. 6B, the locking claw 27A and the claw receiving portion 16A fit together. In the case of FIG. 6B, although not illustrated, the locking claw 27B and the claw receiving portion 16B (refer to FIG. 3) also fit together. The blank plates according to the embodiment make it possible to form a space at the position of the blank plate 1 without having to remove all the blank plates from the rack, as illustrated in FIG. 6B. In this case, the blank plates 2 and 3 are fixed to the support columns of the rack. Thus, by folding the blank plate 1 as illustrated in FIG. 6B, it is possible to place a housing 301 in the space of 1 U where the blank plate 1 previously existed, for example.

FIG. 6C illustrates the state in which the coupled plate members 201 and 202 in the state of FIG. 6B are folded. In the state of FIG. 6C, the locking claw 27A and the claw receiving portion 16A fit together and the locking claw 37A and the claw receiving portion 26A fit together. In the case of FIG. 6C, although not illustrated, the locking claw 27B and the claw receiving portion 16B fit together and the locking claw 37B and the claw receiving portion 26B (refer to FIG. 3) also fit together. The blank plates according to the embodiment make it possible to form a space at the position of the blank plates 1 and 2 without having to remove all the blank plates from the rack, as illustrated in FIG. 6C. In this case, the blank plate 3 is fixed to the support columns of the rack. Thus, by folding the blank plates 1 and 2 as illustrated in FIG. 6C, it is possible to place a housing 302 in the space of 2 U where the blank plates 1 and 2 existed previously, for example.

FIG. 6D illustrates the state in which the plate member 30 in the state of FIG. 6A is folded. In the state of FIG. 6D, the locking claw 37A and the claw receiving portion 26A fit together. In the state of FIG. 6D, although not illustrated, the locking claw 37B and the claw receiving portion 26B (refer to FIG. 3) also fit together. The blank plates according to the embodiment make it possible to form a space at the position of the blank plate 3, without having to remove all the blank plates from the rack, as illustrated in FIG. 6D. In this case, the blank plates 1 and 2 are fixed to the support columns of the rack. Thus, by folding the blank plate 3 as illustrated in FIG. 6D, it is possible to place a housing 303 in the space of 1 U where the blank plate 3 previously existed, for example.

FIG. 6E illustrates the state in which the coupled plate members 201 and 202 in the state of FIG. 6D are folded. In the state of FIG. 6E, the locking claw 37A and the claw receiving portion 26A fit together and the locking claw 27A and the claw receiving portion 16A fit together. In the case of FIG. 6E, although not illustrated, the locking claw 27B and the claw receiving portion 16B fit together and the locking claw 37B and the claw receiving portion 26B (refer to FIG. 3) also fit together. The blank plates according to the embodiment make it possible to form a space at the position of the blank plates 2 and 3 without having to remove all the blank plates from the rack, as illustrated in FIG. 6E. In this case, the blank plate 1 is fixed to the support columns of the rack. Thus, by folding the blank plates 2 and 3 as illustrated in FIG. 6E, it is possible to place a housing 304 in the space of 2 U where the blank plates 2 and 3 existed previously, for example.

As described in the foregoing, by folding each of the plate member 10, the coupled plate members 202 and 201, and the plate member 30 according to the position and size of a space to be opened, it is possible to mount the housing at a desired place without having to remove all the blank plates.

Figure 7A:
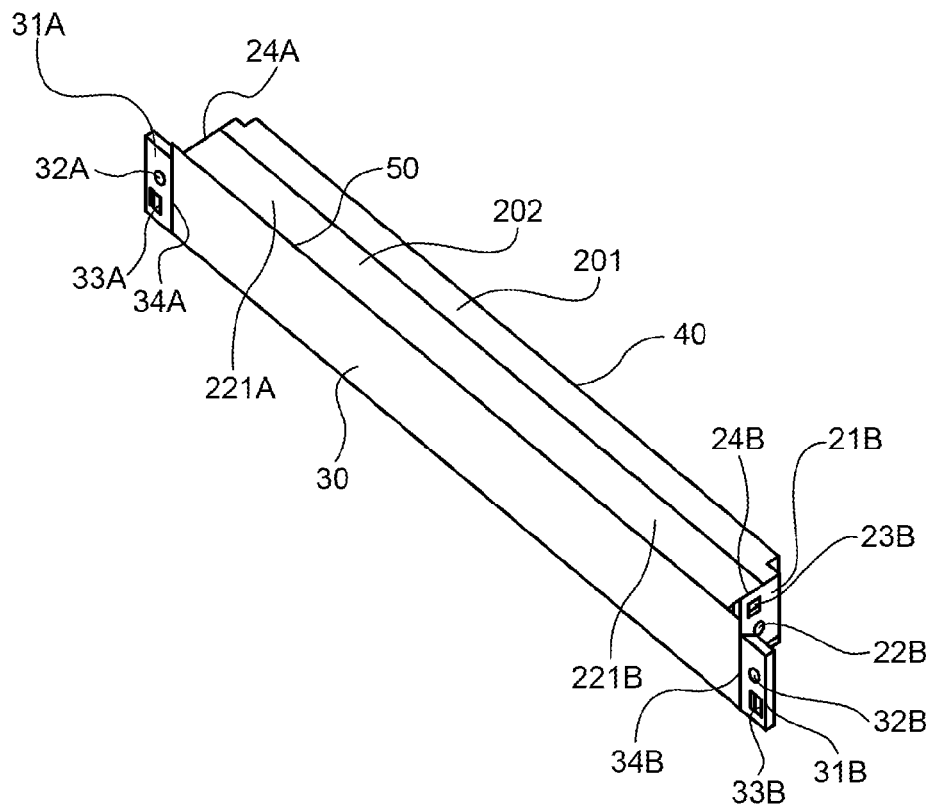
FIG. 7A is a perspective view of the folded blank plates 1 and 2 as seen from above.
Figure 7B:
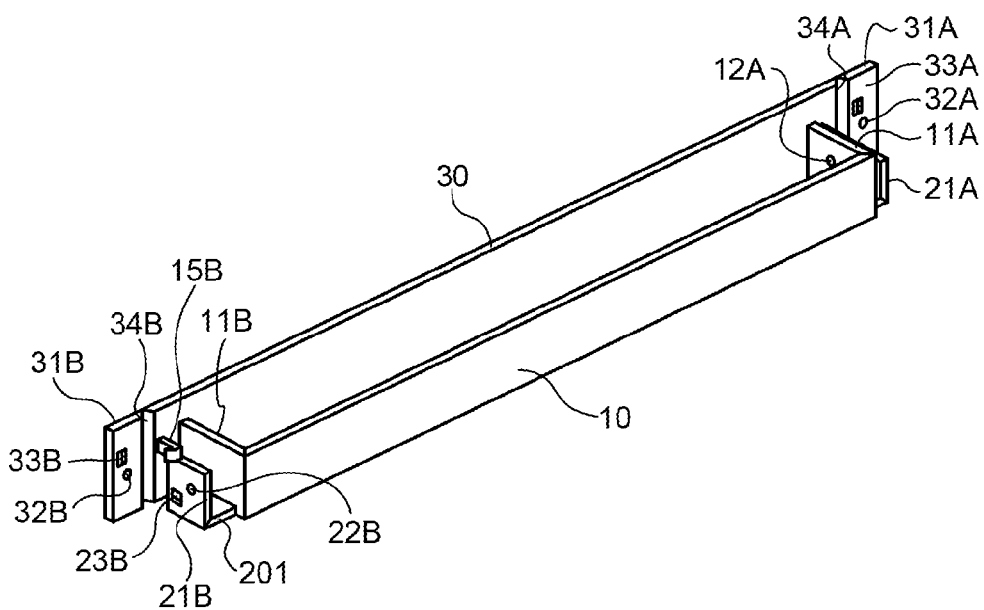
FIG. 7B is a perspective view of the folded blank plates 1 and 2 as seen from below.

FIG. 7A is a perspective view of the folded blank plates 1 and 2 as seen from above. FIG. 7B is a perspective view of the folded blank plates 1 and 2 as seen from below.

FIG. 7A illustrates the state in which the flange portions 11A, 11B, 21A, and 21B are folded and the plate member 10 and the coupled plate members 201 and 202 are folded.

In the state of FIG. 7A, the plate member 30 functions as a blank plate across the support columns of the rack, the plate member 30 is attached to the support columns of the rack through the attachment hole 32A of the flange portion 31A and through the attachment hole 32B of the flange portion 31B. In this case, the flange portions 11B and 21B are folded as illustrated in FIG. 7A and thus do not contact the support columns of the rack. In addition, as not illustrated in FIG. 7A, the flange portions 11A and 21A (refer to FIG. 1) also are folded and thus do not contact the support columns of the rack. Accordingly, it is possible to attach the blank plates to the rack such that only the plate member 30 is located at the front side of the rack.

In that case, as illustrated in FIG. 7B, the blank plates are folded so that the flange portion 11B and the flange portion 21B do not contact and the flange portion 11A and the flange portion 21A do not contact.

Figure 8:
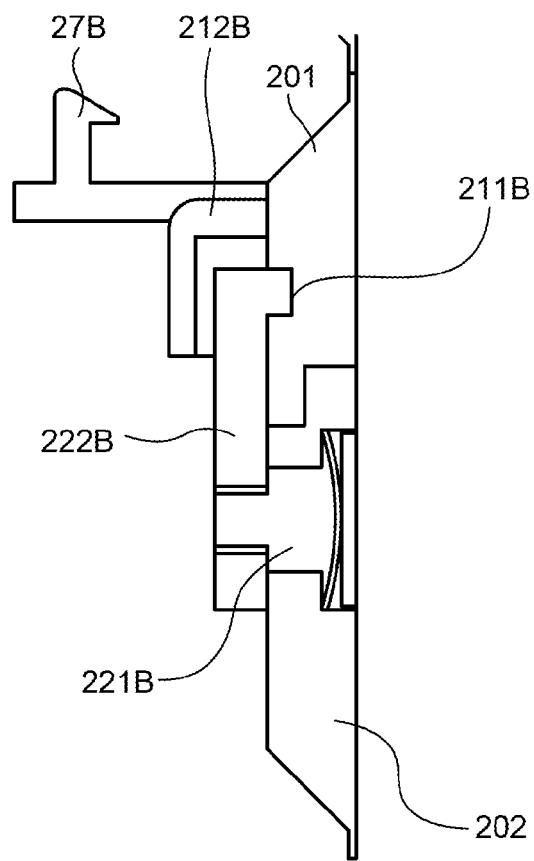
FIG. 8 is a cross section view of FIG. 3 taken along line Y-Y.
Figure 9A:
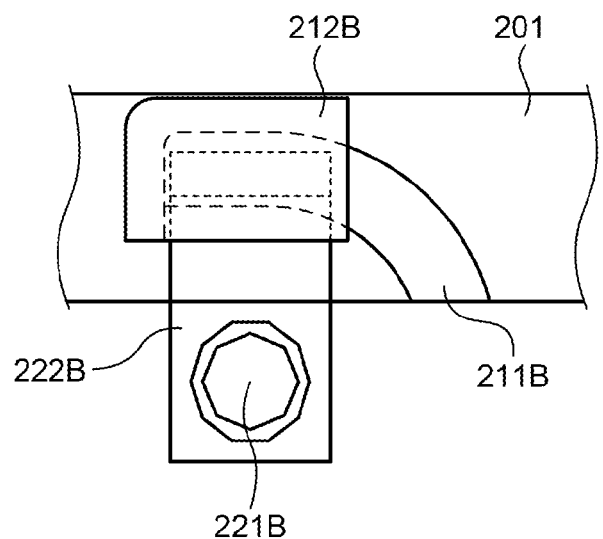
FIG. 9A is a diagram for describing a state of a coupling piece coupled to the blank plate 2.
Figure 9B:
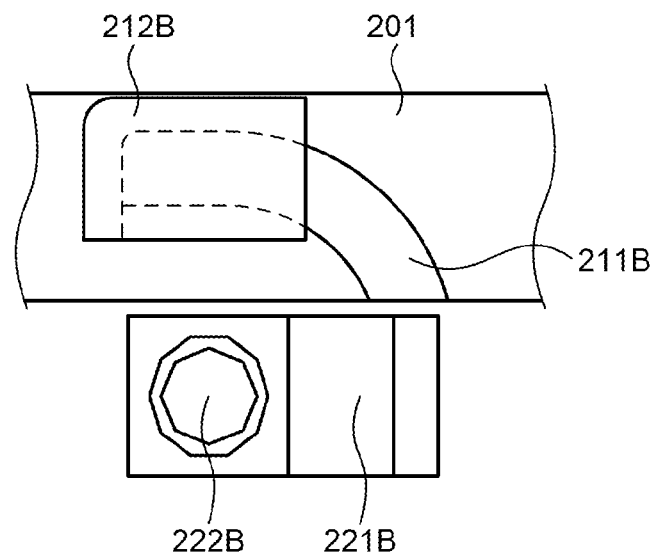
FIG. 9B is a diagram for describing a state of the coupling piece separated from the blank plate 2.
Figure 10A:
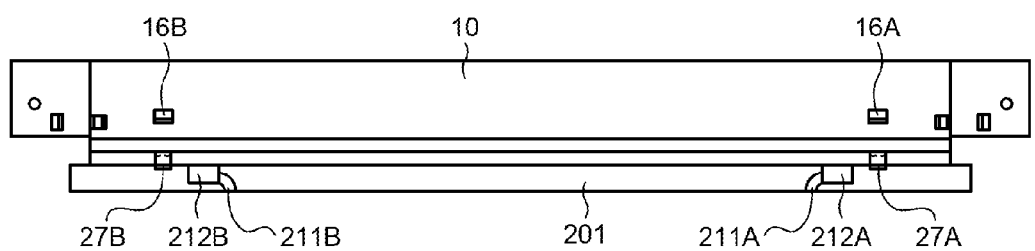
FIG. 10A is a rear view of an upper blank plate with the blank plate 2 separated.
Figure 10B:
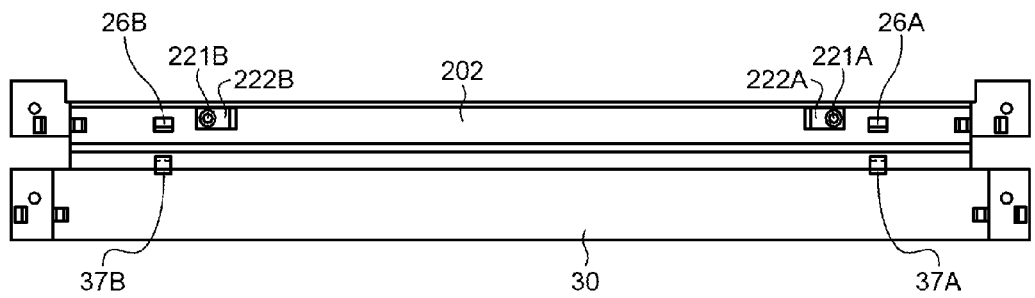
FIG. 10B is a rear view of a lower blank plate with the blank plate 2 separated.

Next, referring to FIGS. 8, 9A, 9B, 10A, and 10B, attachment and detachment of the plate member 201 and the plate member 202 of the blank plate 2 will be described. FIG. 8 is a cross section view of FIG. 3 taken along line Y-Y. FIG. 9A is a diagram for describing the state of a coupling piece coupled to the blank plate 2. FIG. 9B is a diagram for describing the state of the coupling piece separated from the blank plate 2. FIG. 10A is a rear view of an upper blank plate with the blank plate 2 separated. FIG. 10B is a rear view of a lower blank plate with the blank plate 2 separated.

As illustrated in FIG. 8, the coupling piece 222B is rotatably attached to a rear surface of the plate member 202 by the rotation shaft 221B. In addition, the void piece receiving portion 212B protrudes from the rear surface of the plate member 201. Further, the guide groove 211B is formed in the plate member 201 at a position opposed to the piece receiving portion 212B. When the coupling piece 222B is sandwiched and fit between the piece receiving portion 212B and the guide groove 211B, the plate member 201 is sandwiched between the guide groove 211B and the plate member 202. Accordingly, the plate member 201 and the plate member 202 are fixed in the coupled state.

As illustrated in FIGS. 9A and 9B, the guide groove 211B continues from the lower end portion of the plate member 201 to the inside of the piece receiving portion 212B. As illustrated in FIG. 9A, when the plate member 201 and the plate member 202 are coupled together, the coupling piece 222B is stored in the piece receiving portion 212B. When being stored in the piece receiving portion 212B, the coupling piece 222B can maintain coupling between the plate member 201 and the plate member 202 without coming off from the guide groove 211B. Then, in the coupling state illustrated in FIG. 9A, the coupling piece 222B rotates along the guide groove 211B around the rotation shaft 221B. FIG. 9B illustrates the state in which the coupling piece 222B rotates until coming off from the guide groove 211B. In the state of FIG. 9B, since the coupling piece 222B comes off from the guide groove 211B, the plate member 201 is no longer sandwiched between the coupling piece 222B and the plate member 202. Accordingly, the plate member 201 and the plate member 202 are uncoupled and the plate member 201 is detached from the plate member 202.

As in the foregoing, the coupling piece 222B, the guide groove 211B, and the piece receiving portion 212B are described. In addition, the coupling piece 222A, the guide groove 211A, and the piece receiving portion 212A have the same structures as described above except that these components are arranged in bilateral symmetry with respect to the former components.

When the coupling piece 222B enters the state of FIG. 9B and the coupling piece 222A enters the state of FIG. 9B, the blank plate is divided into the detached plate member 201 illustrated in FIG. 10A and the detached plate member 202 illustrated in FIG. 10B.

When the plate member 201 and the plate member 202 are separated from each other, the plate member 10 has the claw receiving portions 16A and 16B, and the plate member 201 has the locking claws 27A and 27B, as illustrated in FIG. 10A. Therefore, when the plate member 201 and the plate member 202 are separated from each other, the plate member 201 make hinge movement toward the rear surface of the plate member 10, and then is fixed perpendicular to the plate member 10 by the claw receiving portions 16A and 16B and the locking claws 27A and 27B.

When the plate member 201 and the plate member 202 are separated from each other, the plate member 202 has the claw receiving portions 26A and 26B, and the plate member 30 has the locking claws 37A and 37B, as illustrated in FIG. 10B. Therefore, when the plate member 201 and the plate member 202 are separated from each other, the plate member 202 make hinge movement toward the rear surface of the plate member 30, and then is fixed perpendicular to the plate member 30 by the claw receiving portions 26A and 26B and the locking claws 37A and 37B.

That is, by separating the plate member 201 and the plate member 202 and fixing the same on the rear sides thereof, it is possible to open only the space at the position of the blank plate 2. Accordingly, it is possible to mount a housing in the space at the position of the blank plate 2 without having to remove all the blank plates.

Figure 11:
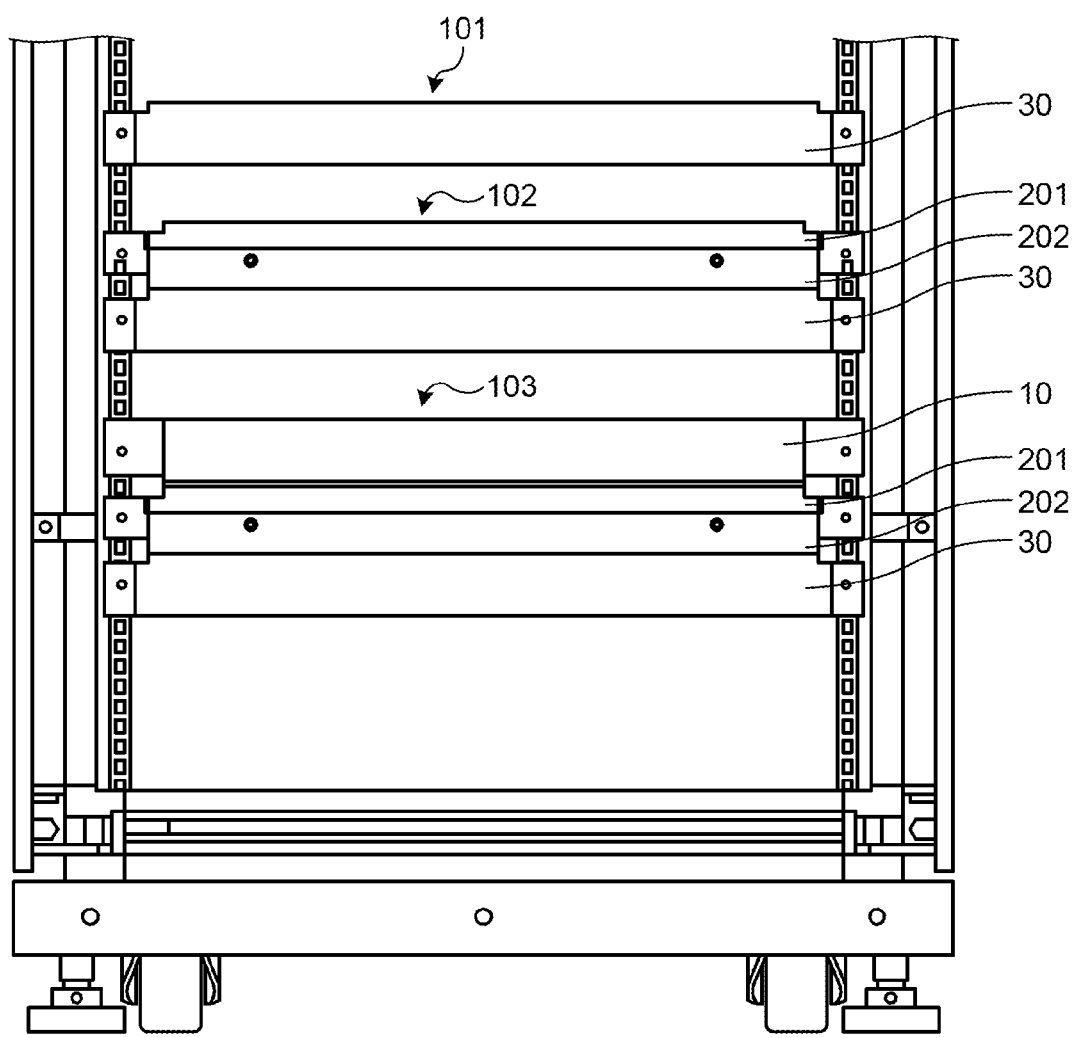
FIG. 11 is a front view of the blank plates according to the first embodiment attached to a rack.

Next, referring to FIG. 11, descriptions will be given as to the state in which the blank plates according to the embodiment are attached to the rack. FIG. 11 is a front view of the blank plates according to the first embodiment attached to the rack.

A blank plate 101 illustrated in FIG. 11 is configured such that the blank plate with which the plate member 10 and the coupled plate members 201 and 202 folded as illustrated in FIG. 6C according to the embodiment is attached to a rack. In this case, the plate member 201 can block a space of 1 U at the front side of the rack.

A blank plate 102 illustrated in FIG. 11 is configured such that the blank plate according to the embodiment in which the plate member 10 is folded as illustrated in FIG. 6B is attached to a rack. In this case, the blank plate 102 can block a space of 2 U at the front side of the rack.

A blank plate 103 illustrated in FIG. 11 is configured such that the blank plate according to the embodiment not folded as illustrated in FIG. 6A is attached to a rack. In this case, the blank plate 103 can block a space of 3 U at the front side of the rack.

As described above, the length of shorter side of the blank plate according to the embodiment can be adjusted to any of sizes of 1 U to 3 U. Therefore, one blank plate can support any of spaces of 1 U to 3 U, which eliminates the need to prepare three kinds of blank plates for 1 U, 2 U, and 3 U and secure a storage space for the blank plates.

In addition, the blank plate according to the embodiment can be changed in the length of the shorter side while being attached to a rack. The blank plate according to the embodiment also makes it possible to open a space of 1 U at a middle portion thereof. Therefore, in either case of adding an electronic device or removing an electronic device, it is possible to eliminate the need for removing blank plates from the rack and selecting and attaching again new blank plates suited for a new space to the rack. That is, it is possible to save a person in charge of installing an electronic device from having to perform the excessive operations. Therefore, the blank plate according to the embodiment makes it easier to form a space suited to the position and size of a housing in which an electronic device is mounted, without needing a storage space for removed blank plates or spare blank plates.

In the embodiment, the blank plate 2 can be separated to open a space only at the position of the blank plate 2. Alternatively, if it is not requested to form a space only at the position of the blank plate 2, it is not requested that the blank plate 2 is configured to be separated.

[b] Second Embodiment

Figure 12:
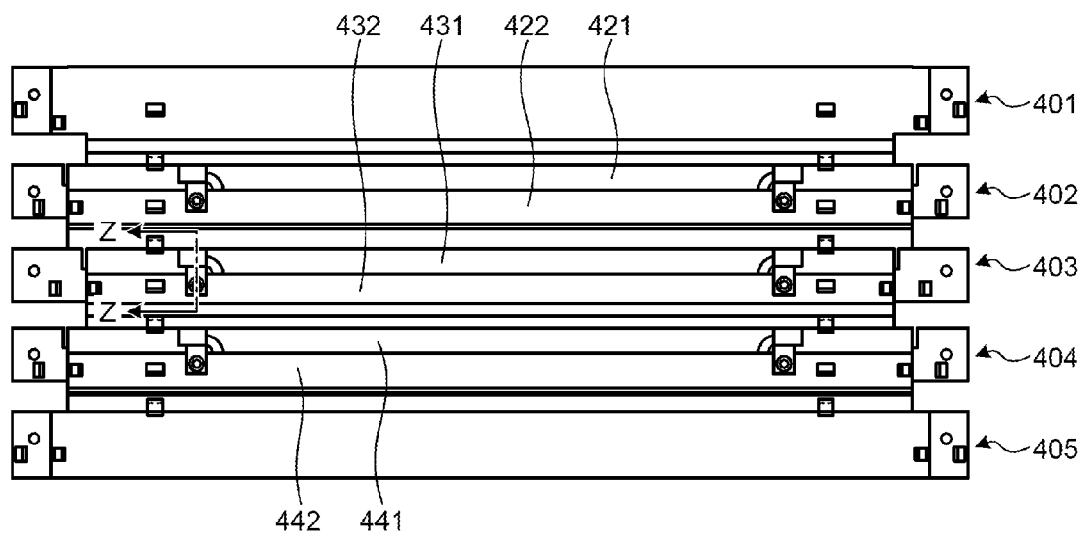
FIG. 12 is a rear view of blank plates according to a second embodiment.

Next, blank plates according to a second embodiment will be described. FIG. 12 is a rear view of the blank plates according to the second embodiment. The blank plates according to the embodiment are formed as blank plates for 5 U by sandwiching blank plates for coupling between the blank plates according to the first embodiment.

As illustrated in FIG. 12, the blank plates according to the embodiment include blank plates 401 to 405. A plate member 421 and a plate member 422 of the blank plate 402 are attachable and detachable. In the following description, for the sake of convenience, the plate member 421 side of the blank plate 402 in which the plate member 421 and the plate member 422 are removed will be referred to as simply "plate member 421," and the plate member 422 side of the same will be referred to as simply "plate member 422." A plate member 431 and a plate member 432 of the blank plate 403 are attachable and detachable. In the following description, for the sake of convenience, the plate member 431 side of the blank plate 403 in which the plate member 431 and the plate member 432 are removed will be referred to as simply "plate member 431," and the plate member 432 side of the same will be referred to as simply "plate member 432." A plate member 441 and a plate member 442 of the blank plate 404 are attachable and detachable. In the following description, for the sake of convenience, the plate member 441 side of the blank plate 404 in which the plate member 441 and the plate member 442 are removed will be referred to as simply "plate member 441," and the plate member 442 side of the same will be referred to as simply "plate member 442."

The structure formed by the blank plate 401 and the plate member 421 is the same as the structure formed by the blank plate 1 and the plate member 201 side of the blank plate 2 according to the first embodiment. The structure formed by the plate member 442 and the blank plate 405 is the same as the structure formed by the plate member 202 side of the blank plate 2 and the blank plate 3 according to the first embodiment. That is, except for the plate members 422, 431, 432, and 441, coupling the plate member 421 and the plate member 442 forms the same blank plate as the blank plate according to the first embodiment.

The plate member 422 and the plate member 431 form a blank plate for coupling. The plate member 432 and the plate member 441 form a blank plate for coupling. Specifically, FIG. 12 illustrates a configuration in which the blank plate for coupling formed by the plate member 422 and the plate member 431 and the blank plate for coupling formed by the plate member 432 and the plate member 441 are sandwiched between the blank plates according to the first embodiment.

Figure 13:
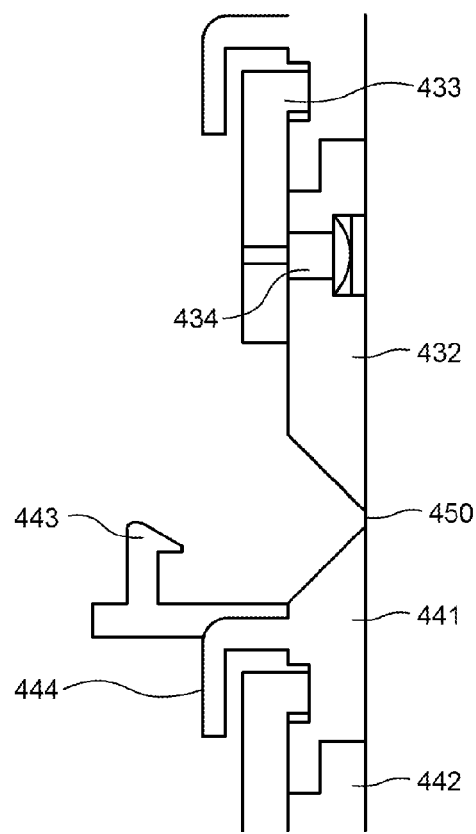
FIG. 13 is a cross section view of FIG. 12 taken along line Z-Z.

Next, referring to FIG. 13, the blank plate for coupling will be described. FIG. 13 is a cross section view of FIG. 12 taken along line Z-Z.

As illustrated in FIG. 13, the plate member 432 and the plate member 441 are coupled together by a coupling portion 450. The coupling portion 450 can be formed by the same method as that for forming the coupling portion 40 and the coupling portion 50 described in relation to the first embodiment, for example.

The plate member 432 is provided with a coupling piece 433. The coupling piece 433 is rotatably attached to the plate member 432 by a rotation shaft 434. The plate member 432 is also provided with a claw receiving portion (not illustrated) that fits a locking claw 443 of a plate member 411 described later when the plate member 432 or the plate member 441 is folded toward the rear side.

The plate member 441 is also provided with a locking claw 443 on the rear side thereof. The plate member 441 is further provided with a claw receiving portion 444.

When the plate member 432 or the plate member 441 is folded toward the rear side thereof, the claw receiving portion of the plate member 432 and the locking claw 443 of the plate member 411 fit together, whereby the plate member 432 and the plate member 441 are fixed to each other.

The plate member 432 and the plate member 441 are fixed together by the locking claw 443 using the same method as that for fixing the plate member 10 and the plate member 201 by the locking claw 27A according to the first embodiment.

The plate member 431 and the plate member 432 are coupled together by the coupling piece 433 in the same manner as that for coupling the plate member 201 and the plate member 202 by the coupling piece 221A according to the first embodiment, for example. The coupling of the plate member 431 and the plate member 432 is equivalent to the coupling of the blank plate for coupling and another blank plate for coupling.

As in the foregoing, the blank plate for coupling formed by the plate member 432 and the plate member 441 is described. The blank plate for coupling formed by the plate member 422 and the plate member 431 has the same structure as described above.

Referring to FIG. 12, the blank plate for coupling with the plate member 422 and the plate member 431 is coupled to the plate member 421 using the same method as that for coupling the plate member 431 and the plate member 432 illustrated in FIG. 13. In addition, referring to FIG. 12, the plate member 442 is coupled to the blank plate for coupling including the plate member 441 and the plate member 431 by using the same method as that for coupling the plate member 431 and the plate member 432 illustrated in FIG. 13.

Figure 14A:
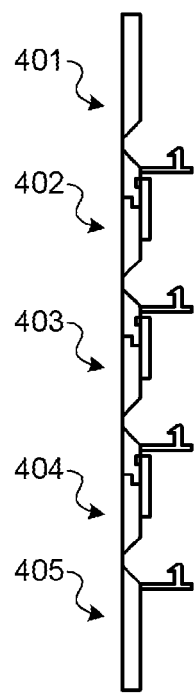
FIG. 14A is a diagram for describing the state in which the blank plates according to the second embodiment are not folded.
Figure 14B:
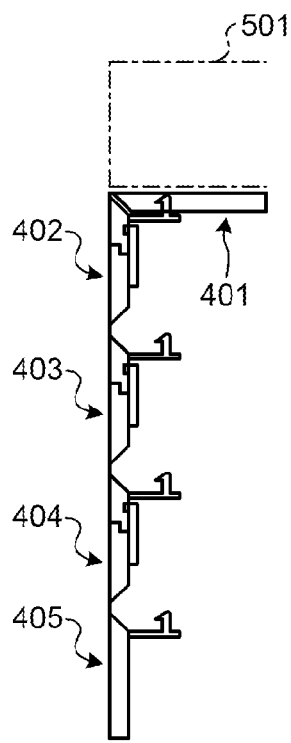
FIG. 14B is a diagram for describing the state in which a housing is mounted at a position of a blank plate 401.
Figure 14C:
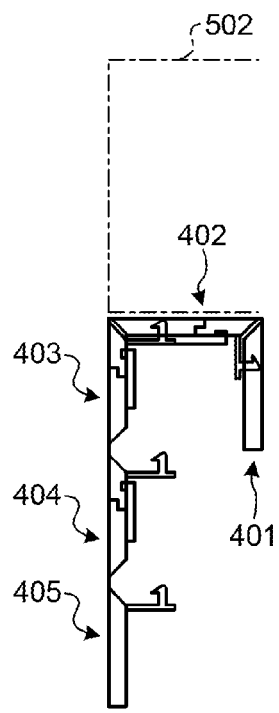
FIG. 14C is a diagram for describing the state in which a housing is mounted at a position of blank plates 401 and 402.
Figure 14D:
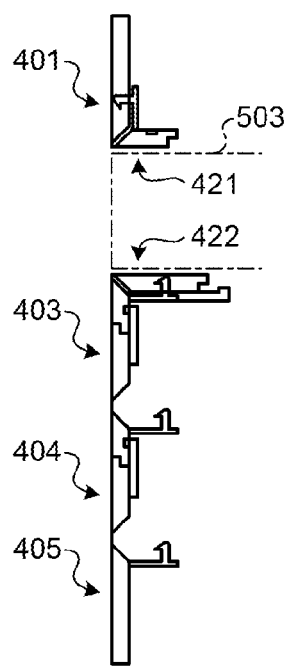
FIG. 14D is a diagram for describing the state in which a hosing is mounted at a position of the blank plate 402.
Figure 14E:
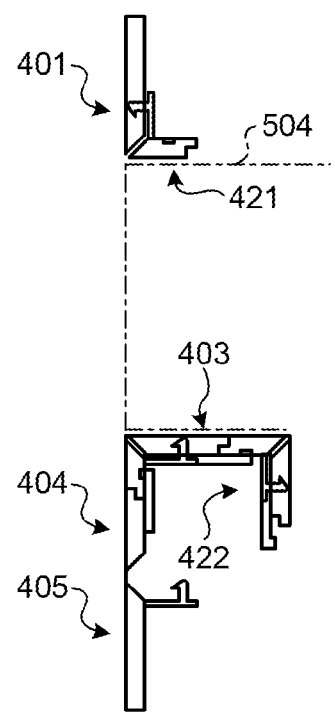
FIG. 14E is a diagram for describing the state in which a housing is mounted on a position of the blank plates 402 and 403.
Figure 14F:
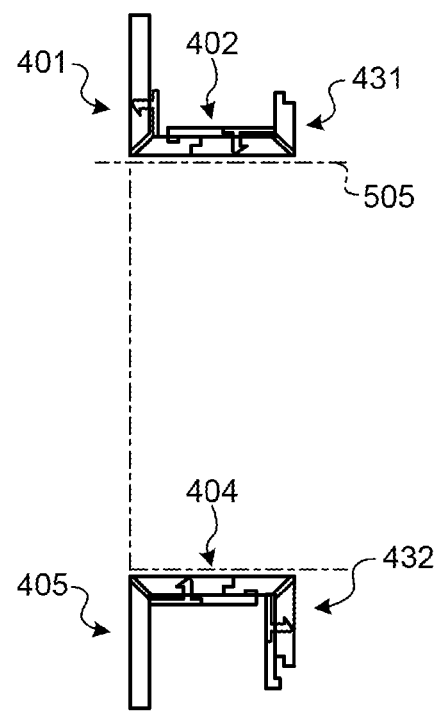
FIG. 14F is a diagram for describing the state in which a housing is mounted at a position of blank plates 402 to 404.

FIG. 14A is a diagram for describing the state in which the blank plates according to the second embodiment are not folded. FIG. 14B is a diagram for describing the state in which a housing is mounted at the position of the blank plate 401. FIG. 14C is a diagram for describing the state in which a housing is mounted at the position of the blank plates 401 and 402. FIG. 14D is a diagram for describing one example of the state in which a housing is mounted at the position of the blank plate 402. FIG. 14E is a diagram for describing one example of the state in which a housing is mounted at the position of the blank plates 402 and 403. FIG. 14F is a diagram for describing one example of the state in which a housing is mounted at the position of the blank plates 402 to 404.

The right side as seen in FIG. 14A refers to the front side of the blank plates, and the left side as seen in FIG. 14A refers to the rear side of the blank plates. In the state of FIG. 14A, the blank plates 401 to 405 are fixed to support columns of the rack. In the state of FIG. 14A, none of the blank plates 401 to 405 is folded and thus there is no space open at the front side of the rack blocked with the blank plates 401 to 405.

FIG. 14B illustrates the state in which the blank plate 401 in the state of FIG. 14A is folded. In the state of FIG. 14B, the locking claw of the blank plate 402 and the claw receiving portion of the blank plate 401 fit together. The blank plates according to the embodiment make it possible to form a space at the position of the blank plate 401 without having to remove all the blank plates from the rack, as illustrated in FIG. 14B. In this case, the blank plates 402 to 405 are fixed to the support columns of the rack. Accordingly, by folding the blank plate 401 as illustrated in FIG. 14B, it is possible to mount a housing 501 in the space of 1 U where the blank plate 401 previously existed, for example.

FIG. 14C illustrates the state in which the blank plate 402 in the state of FIG. 14B is folded. In the state of FIG. 14C, the locking claw of the blank plate 402 and the claw receiving portion of the blank plate 401 fit together, and the locking claw of the blank plate 403 and the claw receiving portion of the blank plate 402 fit together. The blank plates according to the embodiment make it possible to form a space at the position of the blank plates 401 and 402 without having to remove all the blank plates from the rack, as illustrated in FIG. 14C. In this case, the blank plates 403 to 405 are fixed to the support columns of the rack. Accordingly, by folding the blank plates 401 and 402 as illustrated in FIG. 14C, it is possible to mount a housing 502 in the space of 2 U where the blank plates 401 and 402 previously existed, for example.

FIG. 14D illustrates the state in which, in the state of FIG. 14A, the blank plate 402 is separated into the plate member 421 and the plate member 422 and the plate member 421 and the plate member 422 are folded. In the state of FIG. 14D, the locking claw of the plate member 421 and the claw receiving portion of the blank plate 401 fit together. In addition, the locking claw of the blank plate 403 and the claw receiving portion of the plate member 422 fit together. The blank plates according to the embodiment make it possible to form a space at the position of the blank plate 402 without having to remove all the blank plates from the rack, as illustrated in FIG. 14D. In this case, the blank plates 401 and 403 to 405 are fixed to the support columns of the rack. Accordingly, by folding the plate members 421 and 422 as illustrated in FIG. 14D, it is possible to mount a housing 503 in the space of 1 U where the blank plate 402 previously existed, for example.

FIG. 14E illustrates the state in which the blank plate 403 in the state of FIG. 14D is folded. In the state of FIG. 14E, the locking claw of the plate member 421 and the claw receiving portion of the blank plate 401 fit together, the locking claw of the blank plate 403 and the claw receiving portion of the plate member 422 fit together, and the locking claw of the blank plate 404 and the claw receiving portion of the blank plate 403 fit together. The blank plates according to the embodiment make it possible to form a space at the position of the blank plates 402 and 403 without having to remove all the blank plates from the rack, as illustrated in FIG. 14E. In this case, the blank plates 401, 404, and 405 are fixed to the support columns of the rack. Accordingly, after the blank plate 2 is separated, by folding the plate members 421, the blank member 422 and the blank plate 403 as illustrated in FIG. 14E, it is possible to mount a housing 504 in the space of 2 U where the blank plates 402 and 403 previously existed, for example.

FIG. 14F illustrates the state in which, in the state of FIG. 14A, the blank plate 403 is separated into the plate member 431 and the plate member 432, and the blank plate 402, the plate member 431, the plate member 432, and the blank plate 404 are folded. In the state of FIG. 14F, the locking claw of the blank plate 2 and the claw receiving portion of the blank plate 401 fit together, and the locking claw of the plate member 431 and the claw receiving portion of the blank plate 2 fit together. In addition, the locking claw of the blank plate 404 and the claw receiving portion of the plate member 432 fit together, and the locking claw of the blank plate 405 and the claw receiving portion of the blank plate 404 fit together. The blank plates according to the embodiment make it possible to form a space at the position of the blank plates 402 to 404 without having to remove all the blank plates from the rack, as illustrated in FIG. 14F. In this case, the blank plates 401 and 405 are fixed to the support columns of the rack. Accordingly, after the blank plate 3 is separated, by folding the blank plate 402, the plate member 431, the plate member 432, and the blank plate 404 as illustrated in FIG. 14F, it is possible to mount a housing 505 in the space of 3 U where the blank plates 402 to 404 previously existed, for example.

The blank plates according to the embodiment make it possible to form a space of up to 3 U at any of the positions of the blank plates 401 to 405 in addition to the positions as described above. In addition, such a space can be formed using a plurality of methods, depending on the position of the space. For example, in FIG. 14E, the blank plate 402 is separated to form a space at the position of the blank plates 402 and 403. In addition, the blank plate 403 can be separated to form a space at the position of the blank plates 402 and 403.

As described in the foregoing, the blank plates according to the embodiment make it possible to form a space of a desired size at a desired position in the place of 5 U. Accordingly, one blank plate can support spaces of various sizes.

In the embodiment, the blank plates for 5 U are used so that all of the blank plates can be folded even when any of the blank plates in the middle is separated. Alternatively, if up to two blank plates are to be made foldable, blank plates for coupling may be increased to form blank plates of a larger size suited to the front side of the largest rack. In addition, one blank plate for coupling may be used to form blank plates for 4 U.

In the embodiment, the blank plate is separated at one place. Alternatively, the blank plate may be separated at a plurality of places. For example, much more blank plates for coupling may be used to form blank plates for 10 U such that two blank plates for coupling in the middle can be separated to provide two spaces in the place of 10 U.

According to one embodiment of a blank plate disclosed in the subject application, there is provided an advantage that it is possible to form a space suited for the position and size of a housing to be mounted.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A blanking plate for an electronics rack, comprising:
   a first plate-like member that has first attachment portions for attachment to support columns of a rack in the vicinity of both longitudinal ends thereof and has both longitudinal end portions including the first attachment portions capable of performing hinge movement around a direction of a shorter side;
   a second plate-like member that has second attachment portions for attachment to the support columns of the rack in the vicinity of both longitudinal ends thereof, has both longitudinal ends portions including the second attachment portions capable of performing hinge movement around a direction of a shorter side at longitudinal positions different from the hinge positions of the both longitudinal ends portions of the first plate-like member, and has one longer side to which a longer side of the first plate-like member is connected so as to be capable of performing hinge movement;
   a third plate-like member that has third attachment portions for attachment to the support columns of the racks in the vicinity of both longitudinal ends thereof, has both longitudinal ends portions including the third attachment portions capable of performing hinge movement around a direction of a shorter side at longitudinal positions different from the hinge positions of the both longitudinal ends portions of the first plate-like member and the second plate-like member, and has a longer side to which the other longer side of the second plate-like member is connected so as to be capable of performing hinge movement;
   a first lock mechanism that fixes the second plate-like member and the first plate-like member perpendicularly to each other; and
   a second lock mechanism in which the third plate-like member performs hinge movement when the second lock mechanism is released at the side at which the first plate-like member exists with respect to the second plate-like member in a state of being locked by the first lock mechanism to fix the third plate-like member and the second plate-like member perpendicularly to each other.

2. The blanking plate for an electronics rack according to claim 1, wherein the first plate-like member, the second plate-like member, and the third plate-like member each have a both-end lock mechanism by which both longitudinal end portions thereof are perpendicularly bent and fixed.

3. The blanking plate for an electronics rack according to claim 1, wherein the second plate-like member has a first member with a side connected to the first plate-like member, and a second member with a side connected to the third plate-like member, the first member and the second member being attachable and detachable.

4. The blanking plate for an electronics rack according to claim 3, further comprising:
   a coupling plate-like member that has fourth coupling portions for coupling to support columns of the rack in the vicinity of both longitudinal ends thereof, wherein the both longitudinal ends includes the fourth coupling portions capable of performing hinge movement around a direction of a shorter side at positions different from the hinge positions of the both longitudinal end portions of adjacent plate-like members, and when any plate-like member exists next to the adjacent plate-like members, also capable of performing hinge movement around the direction of the shorter side at positions different from the both longitudinal ends of the existing plate-like member next to the adjacent plate-like members, and has a first plate portion and a second plate portion capable of performing hinge movement at longer sides thereof; and
   a coupling member lock mechanism that fixes the coupling plate-like member and the adjacent plate-like member perpendicularly to each other, wherein
   the first plate portion is attachable to and detachable from the first member of the second plate-like member, and
   the second plate portion is attachable to and detachable from the second member of the second plate-like member or the first plate portion.

5. The blanking plate for an electronics rack according to claim 1, wherein the third plate-like member is connected to a side of the second plate-like member opposite to a connect side to which the first plate-like member is connected.

6. The blanking plate for an electronics rack according to claim 1, wherein the first lock mechanism and the second lock mechanism have a fixing claw and a fixing claw receiving portion.

7. A blanking plate for an electronics rack, comprising:
   a first plate-like member that has first attachment portions for attachment to support columns of a rack in the vicinity of both longitudinal ends thereof and has both longitudinal end portions including the first attachment portions capable of performing hinge movement around a direction of a shorter side;

a second plate-like member that has second attachment portions for attachment to the support columns of the rack in the vicinity of both longitudinal ends thereof, has both longitudinal ends portions including the second attachment portions capable of performing hinge movement around a direction of a shorter side at positions different from the hinge positions of the both longitudinal ends portions of the first plate-like member, and has one longer side to which one longer side of the first plate-like member is connected so as to be capable of performing hinge movement;

a third plate-like member that has third attachment portions for attachment to the support columns of the racks in the vicinity of both longitudinal ends thereof, has both longitudinal ends portions including the third attachment portions capable of performing hinge movement around a direction of a shorter side at longitudinal positions different from the hinge positions of the both longitudinal ends portions of the first plate-like member and the second plate-like member, and has one longer side to which the other longer side of the second plate-like member is connected so as to be capable of performing hinge movement;

a fourth plate-like member that has fourth attachment portions for attachment to the support columns of the rack in the vicinity of both longitudinal ends thereof, has both longitudinal ends portions including the fourth attachment portions capable of performing hinge movement around a direction of a shorter side at longitudinal positions different from the hinge positions of the both longitudinal ends portions of the third plate-like member, and has one longer side to which the other longer side of the third plate-like member is connected so as to be capable of performing hinge movement;

a fifth plate-like member that has coupling portions for coupling to the support columns of the rack in the vicinity of both longitudinal ends thereof, has the both longitudinal ends including the coupling portions capable of performing hinge movement around a direction of a shorter side at positions different form the hinge positions of the both longitudinal ends of the third plate-like member and the fourth plate-like member, and has one longer side to which the other longer side of the fourth plate-like member is connected so as to be capable of performing hinge movement;

a first lock mechanism that fixes the second plate-like member and the first plate-like member perpendicularly to each other;

a second lock mechanism in which the third plate-like member performs hinge movement when the second lock mechanism is released at the side at which the first plate-like member exists with respect to the second plate-like member in a state of being locked by the first lock mechanism to fix the third plate-like member and the second plate-like member perpendicularly to each other;

a third lock mechanism in which the fourth plate-like member performs hinge movement at the side at which the second plate-like member exists with respect to the third plate-like member in a state of being locked by the second lock mechanism to fix the fourth plate-like member and the third plate-like member perpendicularly to each other; and a fourth lock mechanism in which the fifth plate-like member performs hinge movement at the side at which the third plate-like member exists with respect to the fourth plate-like member in a state of being locked by the third lock mechanism to fix the fifth plate-like member and the fourth plate-like member perpendicularly to each other, wherein the second plate-like member has a first member with a side connected to the first plate-like member and a second member with a side connected to the third plate-like member, the first member and the second member being attachable and detachable, the third plate-like member has a third member with a side connected to the second plate-like member and a fourth member with a side connected to the fourth plate-like member, the third member and the fourth member being attachable and detachable, and the fourth plate-like member has a fifth member with a side connected to the third plate-like member and a sixth member with a side connected to the fifth plate-like member, the fifth member and the sixth member being attachable and detachable.

* * * * *